(12) United States Patent
Yu et al.

(10) Patent No.: US 10,529,649 B2
(45) Date of Patent: Jan. 7, 2020

(54) HEAT DISSIPATION MODULE

(71) Applicant: Acer Incorporated, New Taipei (TW)

(72) Inventors: Shun-Ta Yu, New Taipei (TW);
Wen-Neng Liao, New Taipei (TW);
Cheng-Yu Cheng, New Taipei (TW);
Jau-Han Ke, New Taipei (TW);
Cheng-Wen Hsieh, New Taipei (TW)

(73) Assignee: Acer Incorporated, New Taipei (TW)

( * ) Notice: Subject to any disclaimer, the term of this patent is extended or adjusted under 35 U.S.C. 154(b) by 128 days.

(21) Appl. No.: 15/828,435

(22) Filed: Dec. 1, 2017

(65) Prior Publication Data

US 2018/0374777 A1 Dec. 27, 2018

(30) Foreign Application Priority Data

Jun. 22, 2017 (TW) .............................. 106120958 A

(51) Int. Cl.
*H01L 23/467* (2006.01)
*H01L 23/427* (2006.01)
*F28F 1/32* (2006.01)
*H01L 23/367* (2006.01)

(52) U.S. Cl.
CPC ............ *H01L 23/467* (2013.01); *F28F 1/325* (2013.01); *H01L 23/427* (2013.01); *H01L 23/3677* (2013.01); *H01L 2924/0002* (2013.01)

(58) Field of Classification Search
CPC . H01L 23/427; H01L 23/467; F28D 15/0233; F28D 15/0275; F28F 1/325; F28F 2215/08
See application file for complete search history.

(56) References Cited

U.S. PATENT DOCUMENTS

2011/0149516 A1* 6/2011 Yang ..................... G06F 1/20
  361/697
2012/0043058 A1* 2/2012 Hwang ............... F28D 15/0275
  165/104.26

FOREIGN PATENT DOCUMENTS

| CN | 2917206 | 6/2007 |
| CN | 204408783 | 6/2015 |
| TW | 581385 | 3/2004 |
| TW | I264268 | 10/2006 |
| TW | 201126325 | 8/2011 |

OTHER PUBLICATIONS

Laboratory of BBK Communication Technology Co., Ltd., "Safety of information technology equipment", National Standards of the Republic of China, Nov. 12, 2011, pp. 1-10.

* cited by examiner

*Primary Examiner* — Marc E Norman
(74) *Attorney, Agent, or Firm* — JCIPRNET

(57) ABSTRACT

A heat dissipation module configured to dissipate heat from a heat source of an electronic device is provided. The heat dissipation module includes a heat pipe, a plurality of fins, and a fan. One end of the heat pipe is in thermal contact with the heat source. The fins are stacked up to be combined with one another and structurally propped against another end of the heat pipe. The fins form a plurality of flow inlets and a plurality of flow outlets. The fan is disposed at the flow inlets, and air flow generated by the fan flows in via the flow inlets and flows out via the flow outlets. A portion of the fin at the flow outlet forms a bending, and a pitch between any adjacent fins at the bending is less than 1 mm to be qualified to achieve a safety certification.

10 Claims, 5 Drawing Sheets

HEAT DISSIPATION MODULE

CROSS-REFERENCE TO RELATED APPLICATION

This application claims the priority benefit of Taiwan application serial no. 106120958, filed on Jun. 22, 2017. The entirety of the above-mentioned patent application is hereby incorporated by reference herein and made a part of this specification.

BACKGROUND

1. Technical Field

The disclosure relates to a heat dissipation module.

2. Description of Related Art

In a conventional heat dissipation module installed in an electronic device, a fan and heat dissipation fins are mainly included to constitute a structure of the heat dissipation module. The heat dissipation fins are disposed at a flow outlet end of the fan and are in contact with the fan. Moreover, the heat dissipation fins are in contact with a heat source as well, such that, when a thermal energy generated by the heat source is transmitted to the heat dissipation fins, cooling wind generated by the fan is directly blown to the heat dissipation fins, blown out through the heat dissipation fins, and then expelled out of a housing through flow outlets of the housing of the electronic device, and heat dissipation is therefore achieved.

In certain electronic devices, for example, a notebook computer, a safety certification is required to be complied. Meaning that in the notebook computer, since an opening of the housing acts as flow inlets or flow outlets of said heat dissipation module, a caliber of the opening is required to be maintained to be less than a certain value, so as to prevent a foreign object from entering into the electronic device easily through the opening of the housing, which may affect electronic components or electrocircuits in the electronic device or even cause short circuits. Nevertheless, in such a structure of the heat dissipation module, a size of a flow channel of air flow is limited, favorable heat dissipation effect may not be achieved as a result.

SUMMARY

The disclosure provides a heat dissipation module which has a flow channel size suitable for air flow to dissipate heat and satisfies requirements for a safety certification.

A heat dissipation module of the embodiments of the disclosure is configured to dissipate heat from a heat source of an electronic device. The heat dissipation module includes a heat pipe, a plurality of fins, and a fan. One end of the heat pipe is in thermal contact with the heat source. The fins are stacked up to be combined with one another and structurally propped against another end of the heat pipe. The fins form a plurality of flow inlets and a plurality of flow outlets. The fan is disposed at the flow inlets, and air flow generated by the fan flows in the fins via the flow inlets and flows out of the fins via the flow outlets. Portions of the fins at the flow outlets form a plurality of bendings, and a pitch between any adjacent fins at the bendings is less than 1 mm to be qualified to achieve a safety certification.

To sum up, in the heat dissipation module, the pitches are adjusted through whether the fins are bent, such that the pitches less than 1 mm are folioed at the bendings through collocation between different pitch sizes between the pins. As such, the requirements for the safety certification are satisfied, and a foreign object is thus prevented from entering into the electronic device through the fins. Simultaneously, the pitches between the portions of the fins that are not bent still maintain to be greater than 1 mm, such that, the air flow generated by the fan to dissipate heat may be maintained to pass through smoothly. Accordingly, the heat dissipation module is able to provide adaptability which satisfies the safety certification and at the same time delivers heat dissipation performance.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
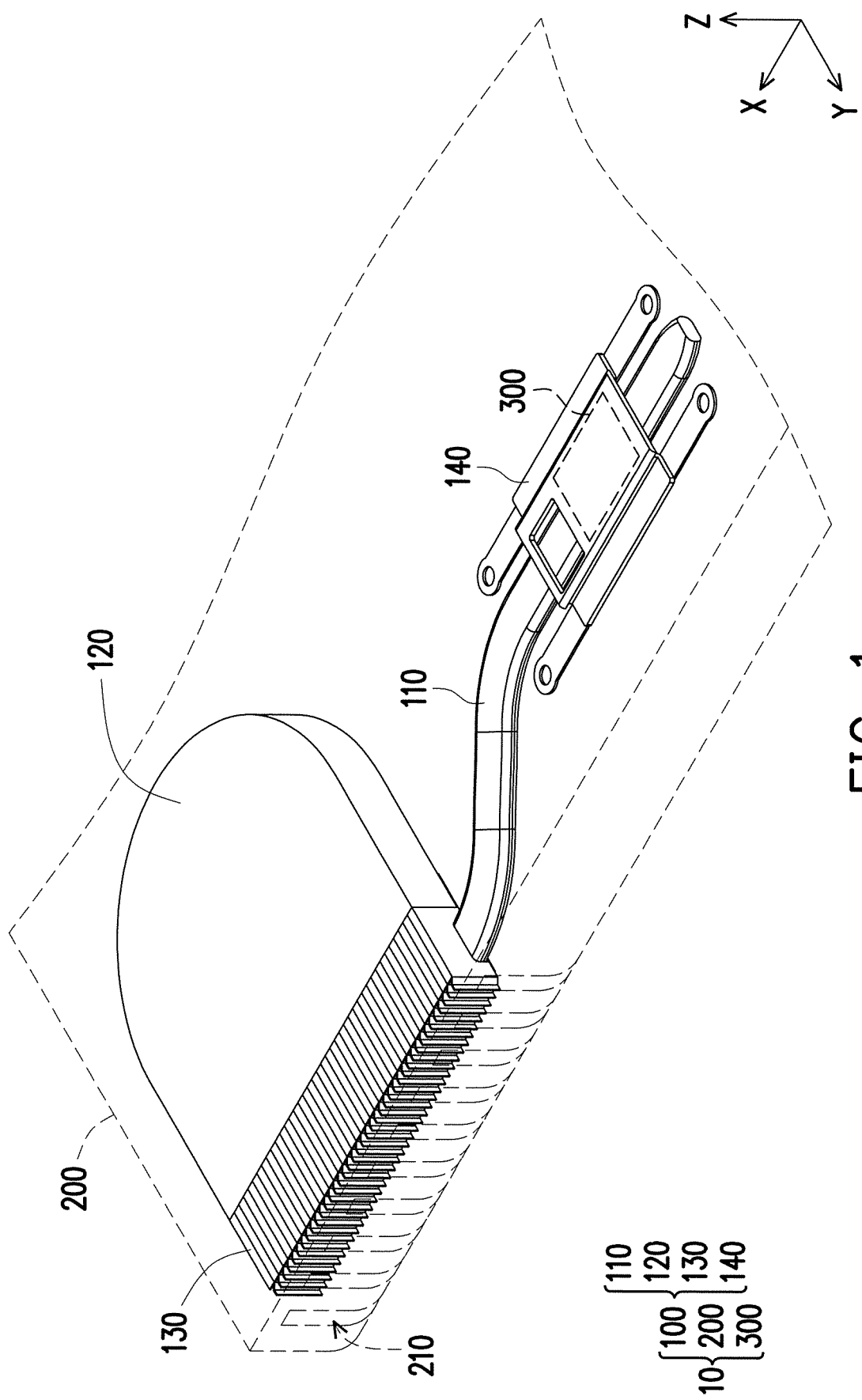
FIG. 1 is a schematic view of a heat dissipation module according to an embodiment of the disclosure.
Figure 2:
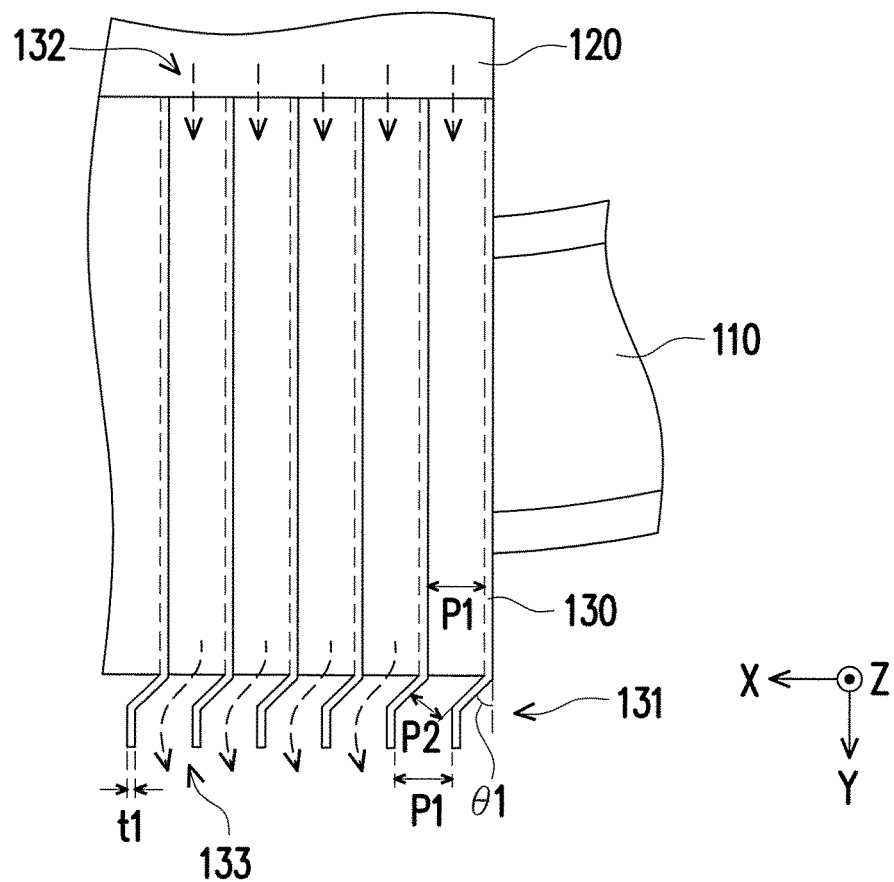
FIG. 2 is a local top view of the heat dissipation module of FIG. 1.
Figure 3:
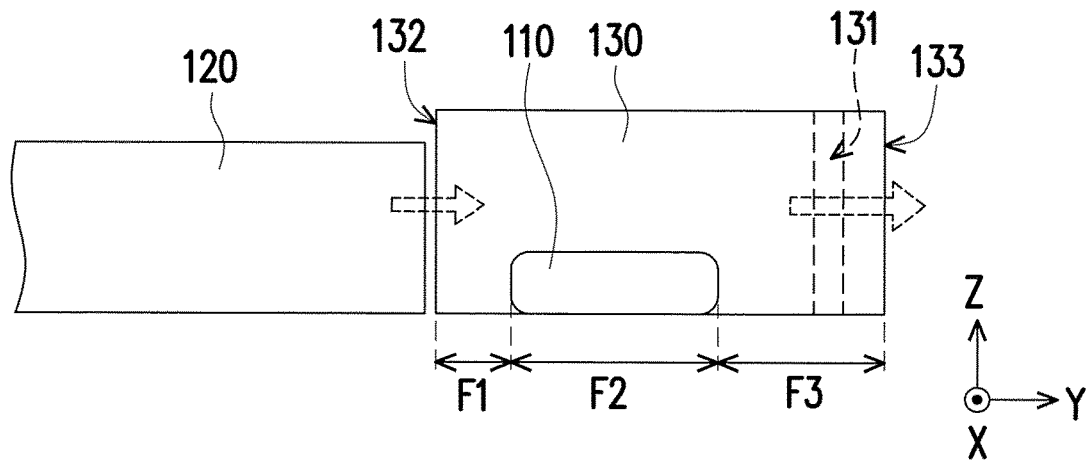
FIG. 3 is a local side view of the heat dissipation module of FIG. 1.

FIG. 1 is a schematic view of a heat dissipation module according to an embodiment of the disclosure. FIG. 2 is a local top view of the heat dissipation module of FIG. 1. FIG. 3 is a local side view of the heat dissipation module of FIG. 1. A Cartesian coordinate X-Y-Z is provided herein for ease of description.

Referring to FIG. 1 to FIG. 3, in the present embodiment, a heat dissipation module 100 is adapted to be disposed in a housing 200 of an electronic device 10. The electronic device 10 is exemplified as a notebook computer, and that heat dissipation s performed to a heat source 300 (e.g., a processor or a display chip) of the electronic device 10. The heat dissipation module 100 includes a heat pipe 110, a fan 120, a plurality of fins 130, and a fixing member 140. As shown in FIG. 1, one end (right side of the drawing) of the heat pipe 110 is in thermal contact with the heat source 300 of the electronic device 10, for example, the heat pipe 110 is fixed on a printed circuit board (not shown) through the fixing member 140, such that the heat pipe 110 is in structural contact with the heat source 300 directly or indirectly. As such, through a phase change of a working fluid in the heat pipe 110, a quantity of heat is transmitted to another end (left side of the drawing) of the heat pipe 110.

The fins 130 are stacked up horizontally to be combined with one another along an X-axis so as to form a plurality of flow channels arranged along the X-axis (and parallel to a Y-Z plane), and thus a plurality of flow inlets 132 and a plurality of flow outlets 133 are formed. The fan 120 is disposed at the flow inlets 132 and is configured to generate air flow (as shown by the dotted line arrows in FIG. 2), which flows into the flow channels among the fins 130 via the flow inlets 132 and flows out of the flow channels via the flow outlets 133. In other words, after transmitting the quantity of heat from the heat source 300 to the fins 130 through the phase change (e.g., a conversion between a liquid phase and a vapor phase) generated by the working fluid (not shown) inside, the heat pipe 110 is able to dissipate heat for the fins 130 through the air flow (as shown by the dotted line arrows in FIG. 2 and FIG. 3) generated by the fan 120. Furthermore, the quantity of heat is removed from the fins 130 and is dissipated out of the electronic device 10 along with the air flow through opening holes 210 (illustrated in FIG. 1) of the housing 200, so as to achieve heat dissipation effect.

As described above, the notebook computer is required to comply with a safety certification so as to prevent a foreign object larger than a standard of the safety certification from entering through pitches between the fins 130, damaging internal electronic components of the fan 120, and affecting heat dissipation performance. As such, in the present embodiment, portions of the fins 130 at the flow outlets 133 form a plurality of bendings 131, and pitches P2 between the adjacent fins 130 at the bendings 131 are less than 1 mm for being in line with the safety certification. Accordingly, the foreign object is prevented from entering into the electronic device 10 through the fins 130 which may lead to unfavorable influences. Here, the safety certification refers to the IEC 60950.

Referring to FIG. 2 and FIG. 3, the air flow generated by the fan 120 is also required to dissipate heat for the fins 130 more effectively while the safety certification is required to be satisfied at the same time. As such, in the present embodiment, all of the pitches between the fins 130 are not required to be less than 1 mm from the flow inlets 132 to the flow outlets 133. In other words, in the present embodiment, the pitch P1 between portions of the fins 130 that are not bent is still greater than 1 mm.

Accordingly, as the bendings 131 exist at the flow outlets 133 of the fins 130, meaning that the bendings 131 are adjacent to the opening holes 210 of the housing 200, as such, the electronic device 10 is able to provide favorable blocking effect from an external foreign object. Simultaneously, except for the portions of the fins 130 forming the bendings 131, the rest of the portions of the fins 130 still maintain at a pitch configuration which provides favorable heat dissipation effect, such that, through forming of the bendings 131 by the fins 130 and collocation of the pitches P1 and P2, the heat dissipation module 100 of the present embodiment 100 is able to satisfy the requirements of heat dissipation as well as safety certification.

Specifically, referring to FIG. 3, an orthogonal projection contour of the fin 130 on a virtual plane (an X-Y plane as shown in FIG. 3) where the heat pipe 110 is located on is divided into a first region F1, a second region F2, and a third region F3. The second region F2 is located between the first region F1 and the third region F3, the first region F1 is equipped with the flow inlet 132, and the third region F3 is equipped with the flow outlet 133. The heat pipe 110 is structurally propped against the second region F2, for example, engaged with a recess of the fin 130, such that the heat pipe 110 is able to penetrate through the fin 130. The bending 131 is located in the third region F3. Here, the fin 130 stands on and is orthogonal to the virtual plane (the X-Y plane), and a flow direction of the air flow (as shown by the dotted line arrows) is parallel to the virtual plane (the X-Y plane).

Corresponding relationships among the pitches P1 and P2, a thickness t1, and bending angles $\theta 1$ of the fins 130 are provided as follows in (Table 1), referring to FIG. 2 and (Table 1):

TABLE 1

| Fin Thickness t1: 0.2 mm | | | | | |
|---|---|---|---|---|---|
| | | \multicolumn{4}{c}{Fin Pitch P1 (mm)} |
| | | 1.2 | 1.4 | 1.6 | 1.8 |
| | | \multicolumn{4}{c}{Fin Pitch P2 (mm)} |
| Bending Angle $\theta 1$ (°) | 25 | — | — | — | 0.76 |
| | 30 | 0.6 | 0.7 | 0.8 | 0.9 |
| | 35 | 0.69 | 0.8 | 0.92 | 1.03 |
| | 40 | 0.77 | 0.9 | 1.03 | — |
| | 45 | 0.85 | *0.99* | 1.13 | — |
| | 50 | 0.92 | 1.07 | 1.23 | — |
| | 55 | 0.98 | 1.15 | 1.31 | — |
| | 60 | 1.04 | 1.21 | 1.39 | — |

Maximum bending angles required in order to correspond to different pitches P1 between the fins 130 and enable the pitches P2 to be maintained are clearly obtained from the foregoing (Table 1). For instance, as shown by the bold italic number "0.99" in (Table 1), when the pitch P1 between the fins 130 is 1.4 mm, under the premise that the pitch P2 between the fins 130 is required to be less than 1 mm, the bending angle $\theta 1$ allowed is substantially required to be less than 45 degrees. In this way, the corresponding bending angles $\theta 1$ are thus generated according to the different thicknesses t1 of the fins 130 and the different pitches P1 between the fins 130 for a user.

Figure 4A:
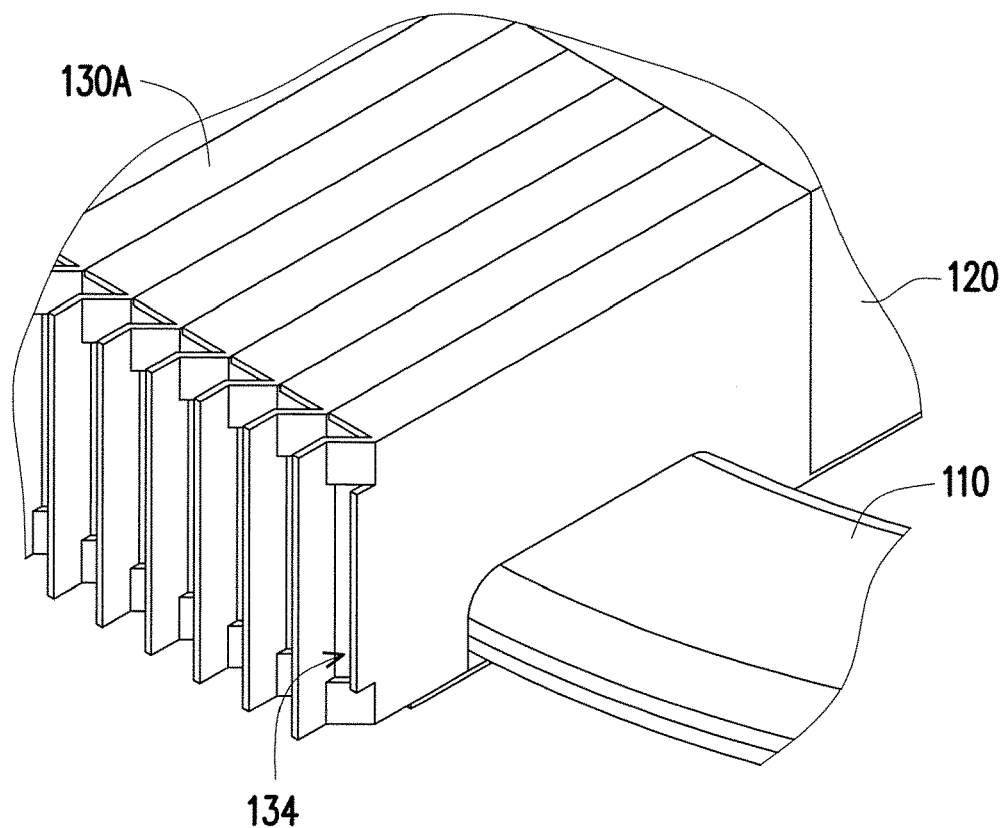
FIG. 4A is a schematic local view illustrating a heat dissipation module according to another embodiment of the disclosure.
Figure 4B:
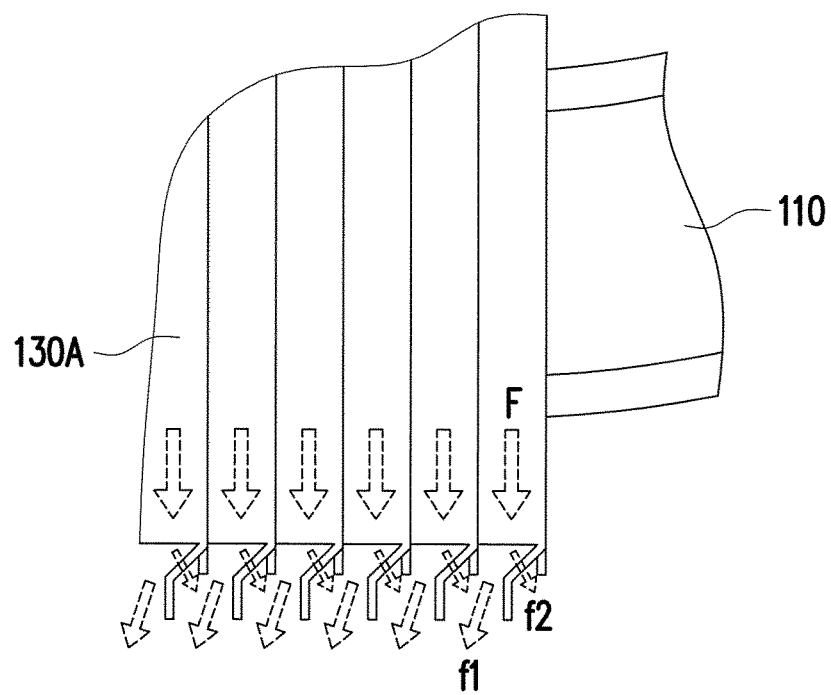
FIG. 4B illustrates a local top view of FIG. 4A.

FIG. 4A is a schematic local view illustrating a heat dissipation module according to another embodiment of the invention. FIG. 4B illustrates a local top view of FIG. 4A. Referring to FIG. 4A and FIG. 4B, different from the foregoing embodiments, in the present embodiment, a portion of a fin forming a bending further includes a breach 134, and an orthogonal projection size of the breach 134 on the X-Y plane is less than 1 mm. As such, fins 130A are able to provide greater quantity of flow at flow outlets, meaning that in addition to an air flow f1 flowing out of bendings, an air flow f2 flowing out of the breaches 134 also exists. Thus, quantity of flow of an air flow F of the fins 130A at portions of the fins 130A that are not bent is a sum of the air flow f1 and the air flow f2, such that the quantity of flow of the air flow is increased. In other words, calibers of the fins 130A at the flow outlets are expanded, which is conducive to increasing the quantity of flow of the air flow flowing through the fins 130A.

Figure 5:
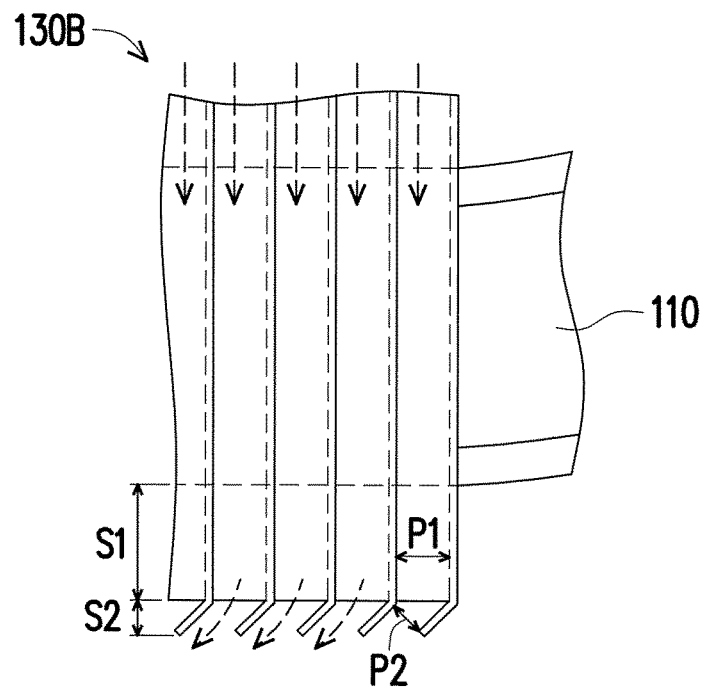
FIG. 5 to FIG. 7 are local top views respectively illustrating heat dissipation modules according to different embodiments of the disclosure.
Figure 6:
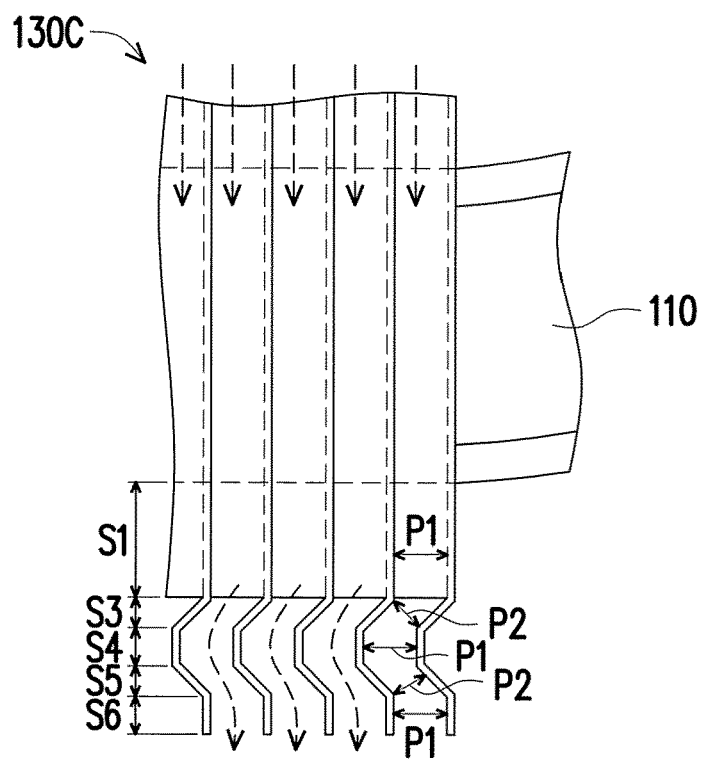
Figure 7:
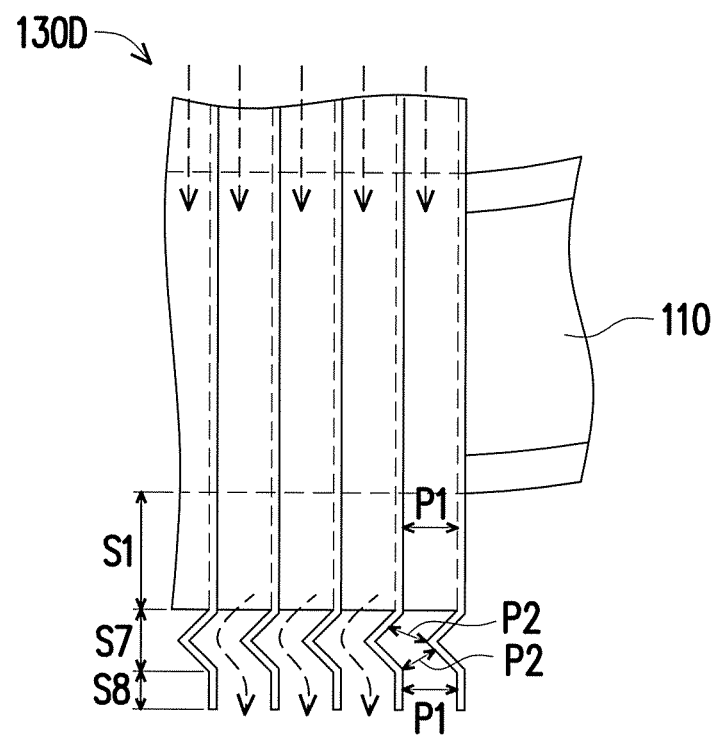

FIG. 5 to FIG. 7 are local top views respectively illustrating heat dissipation modules according to different embodiments of the invention. Appearance changes of the fins at the flow outlets are described in detail herein, and the rest of the omitted contents may be acquired from the foregoing embodiments and thus will not be repeated hereinafter. Referring to FIG. 5, in the present embodiment, fins 130B have a first segment S1 and a second segment S2 at flow outlets, and portions of the fins 130B at the second segment S2 form bendings. Pitches P1 between the fins 130B at the first segment S1 are greater than 1 mm, and pitches P2 at the second segment S2 are less than 1 mm.

Referring to FIG. 6, in the present embodiment, fins 130C have a first segment S1, second segments S3 and S5, a third segment S6, and a fourth segment S4. The second segment S3 is connected between the first segment S1 and the third segment S6, the other second segment S5 is connected between the third segment S6 and the fourth segment S4, and the fourth segment S4 is connected between the two second segments S3 and S5. Here, extending directions of each of the fins 130C at the first segment S1, the third segment S6, and the fourth segment S4 are identical, and pitches P1 between the fins 130C are all identical and greater than 1 mm. The fourth segment S4 is viewed as to be deviated in parallel to (horizontally dislocated on) the first segment S1 and the third segment S6. Similarly, pitches between the second segments S3 and S5 are all less than 1 mm.

Referring to FIG. 7, in the present embodiment, fins 130D have a first segment S1, two second segments S7, and a third segment S8 at flow outlets. The two second segments S7 are connected between the first segment S1 and the third segment S8 and are adjacent to each other to form a bending. In the fins 130D, pitches P1 at the first segment S1 and pitches P1 at the third segment S8 are identical and are greater than 1 mm, and similarly, since a bending is formed between the second segments S7, pitches P2 are less than 1 mm.

Figure 8:
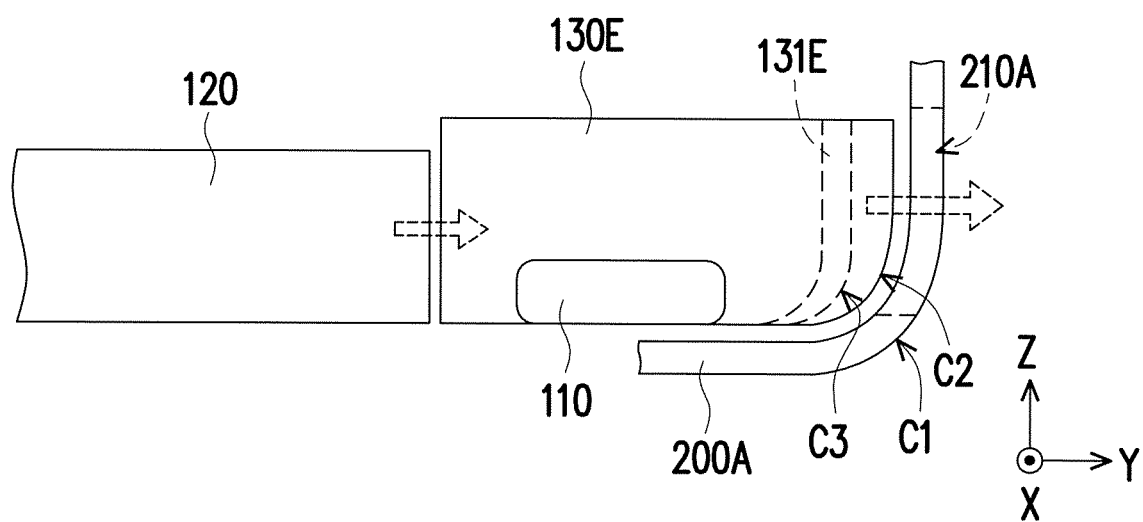
FIG. 8 is a local side view illustrating a heat dissipation module according to another embodiment of the disclosure.

FIG. 8 is a local side view illustrating a heat dissipation module according to another embodiment of the invention. Here, along with changes of a contour of a housing 200A of an electronic device, in a heat dissipation module, contours of a fin 130E and a bending 131E change as well, such that the heat dissipation module is able to provide favorable adaptability, which is conducive to usage of internal space in the housing 200A. Here, a contour C2 of the fin 130E at a flow outlet, a contour C3 of the bending 131E, and a contour C1 of the housing 200A are identical to one another (chamfered fillets are illustrated as examples here, but the invention is not limited thereto), such that air flow can be smoothly blown out of the housing 200A through an opening hole 210A.

In view of the foregoing, as the heat dissipation module is required to comply with the safety certification to be installed on the electronic device and to be equipped with heat dissipation performance of the heat dissipation module itself at the same time, in the embodiments of the invention, the portions of the fins of the heat dissipation module adjacent to the flow outlets form the bendings, and that the pitches between the bent fins are less then 1 mm, so as to satisfy the requirements for the safety certification. Simultaneously, the pitches between the portions of the fins that are not bent still maintain to be greater than 1 mm.

To be more specifically, the heat pipe is configured to penetrate through and be in contact with the portions of the fins that are not bent, and the pitches between the fins at the flow inlets maintain to be wider, as such, in terms of heat dissipation performance, as greater quantity of flow of air flow passes through the fins owing to the wider pitches, heat dissipation performance is therefore enhanced. Furthermore, the flow outlets formed by the fins are adjacent to the opening holes of the housing, such that, in the electronic device, a foreign object outside of the housing is prevented from entering into the electronic device easily through the opening holes or the fins, which also enables the heat dissipation module to comply with the safety certification. In addition, suitable bending angles or breaches at the flow outlets are adaptively provided in accordance with the thickness of and the pitches between the fins, such that, the air flow generated by the fan may smoothly pass through the fins so as to achieve heat dissipation effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A heat dissipation module, configured to dissipate heat from a heat source of an electronic device, the heat dissipation module comprising:

a heat pipe, one end of the heat pipe being in thermal contact with the heat source;

a plurality of fins, stacked up to be combined with one another and structurally propped against another end of the heat pipe, the fins forming a plurality of flow inlets and a plurality of flow outlets; and a fan, disposed at the flow inlets, air flow generated by the fan flowing in the fins via the flow inlets and flowing out of the fins via the flow outlets, wherein portions of the fins at the flow outlets form a plurality of bendings, and a pitch between any adjacent fins at the bendings is less than 1 mm, wherein each of the fins has a breach at the bending.

2. The heat dissipation module as claimed in claim 1, wherein an orthogonal projection contour of the fins on a virtual plane where the heat pipe is located on is divided into a first region, a second region, and a third region, the second region is located between the first region and the third region, the first region is equipped with the flow inlets, the third region is equipped with the flow outlets, the heat pipe is structurally propped against the second region, and the bendings are located in the third region, the fins are orthogonal to the virtual plane, and a flow direction of the air flow is parallel to the virtual plane.

3. The heat dissipation module as claimed in claim 1, wherein a pitch between any adjacent portions of the fins that are not bent is greater than 1 mm.

4. The heat dissipation module as claimed in claim 1, wherein the heat pipe is in contact with portions of fins that are not bent.

5. The heat dissipation module as claimed in claim 1, wherein the electronic device is further equipped with a housing, and a contour of the fins at the flow outlets, a contour of the bendings, and a contour of the housing are identical to one another.

6. A heat dissipation module, configured to dissipate heat from a heat source of an electronic device, the heat dissipation module comprising:

a heat pipe, one end of the heat pipe being in thermal contact with the heat source;

a plurality of fins, stacked up to be combined with one another and structurally propped against another end of the heat pipe, the fins forming a plurality of flow inlets and a plurality of flow outlets; and a fan, disposed at the flow inlets, air flow generated by the fan flowing in the fins via the flow inlets and flowing out of the fins via the flow outlets, wherein portions of the fins at the flow outlets form a plurality of bendings, and a pitch between any adjacent fins at the bendings is less than 1 mm, wherein each of the fins has a first segment and at least one second segment at the flow outlet, the at least one second segment forms the bending, and a pitch between the fins at the first segment is greater than 1 mm.

7. A heat dissipation module, configured to dissipate heat from a heat source of an electronic device, the heat dissipation module comprising:
   a heat pipe, one end of the heat pipe being in thermal contact with the heat source;
   a plurality of fins, stacked up to be combined with one another and structurally propped against another end of the heat pipe, the fins forming a plurality of flow inlets and a plurality of flow outlets; and
   a fan, disposed at the flow inlets, air flow generated by the fan flowing in the fins via the flow inlets and flowing out of the fins via the flow outlets, wherein portions of the fins at the flow outlets form a plurality of bendings, and a pitch between any adjacent fins at the bendings is less than 1 mm, wherein each of the fins at the flow outlet has a first segment, at least one second segment, and a third segment, the at least one second segment is connected between the first segment and the third segment and forms the bending, and pitches between the fins at the first segment and pitches between the fins at the third segment are greater than 1 mm respectively.

8. The heat dissipation module as claimed in claim 7, wherein extending directions of each of the fins at the first segment and at the third segment are identical, and the pitches are identical.

9. The heat dissipation module as claimed in claim 7, wherein each of the fins has a plurality of second segments and a fourth segment at the flow outlets, the second segments are connected between the first segment and the third segment, the fourth segment is connected between the second segments, extending directions of each of the fins at the first segment, at the third segment, and at the fourth segment are identical, and the pitches are identical.

10. The heat dissipation module as claimed in claim 9, wherein the first segment and the third segment are located on a same axis, and the fourth segment is dislocated relative to the first segment and the third segment in each of the fins.

* * * * *